US008196015B2

(12) United States Patent
Živic et al.

(10) Patent No.: US 8,196,015 B2
(45) Date of Patent: Jun. 5, 2012

(54) METHOD FOR TRANSMITTING AND RECEIVING A DATA BLOCK AND A CORRESPONDING TRANSMITTER AND RECEIVER

(75) Inventors: Nataša Živic, Siegen (DE); Christoph Ruland, Siegen (DE)

(73) Assignee: Secutanta GmbH, Siegen (DE)

( * ) Notice: Subject to any disclaimer, the term of this patent is extended or adjusted under 35 U.S.C. 154(b) by 0 days.

(21) Appl. No.: 13/054,512

(22) PCT Filed: May 28, 2009

(86) PCT No.: PCT/EP2009/056576
§ 371 (c)(1),
(2), (4) Date: Jan. 17, 2011

(87) PCT Pub. No.: WO2010/012524
PCT Pub. Date: Feb. 4, 2010

(65) Prior Publication Data
US 2011/0138257 A1    Jun. 9, 2011

(30) Foreign Application Priority Data

Jul. 28, 2008  (DE) .................. 10 2008 040 797

(51) Int. Cl.
*H03M 13/00* (2006.01)
(52) U.S. Cl. ......... 714/758; 714/755; 714/786; 714/807
(58) Field of Classification Search .............. 714/755, 714/777, 780; 375/340, 341
See application file for complete search history.

(56) References Cited

U.S. PATENT DOCUMENTS 5,742,622 A * 4/1998 Claydon et al. ............. 714/789
(Continued)

FOREIGN PATENT DOCUMENTS

EP    2048790 A1    4/2009
(Continued)

OTHER PUBLICATIONS

Ruland C et al: "Feedback in Joint channel coding and cryptography" 7th International ITG Conference on Source and Channel Coding (SCC'08), Vde Verlag, DE, Jan. 16, 2008, pp. 1-7, XP008109390, ISBN: 978-3-8007-3077-3.

(Continued)

*Primary Examiner* — Esaw Abraham
(74) *Attorney, Agent, or Firm* — Hulsey, P.C.; William N. Hulsey, III; Loren T. Smith

(57) ABSTRACT

The invention relates to a method for transmitting a data block (104) via a message channel (130), said method having the following steps of: —subdividing the data block into at least one first sub-block (108) and one second sub-block (110), —generating first check data (114) for the first sub-block (108) and second check data (116) for the second sub-block (110), wherein a first transmission sub-block (118) is formed by the first sub-block and the first check data, and wherein a second transmission sub-block (120) is formed by the second sub-block and the second check data, —transmitting the first and second transmission sub-blocks in a transmission block (124) via the message channel, wherein the order of the bits to be transmitted in the transmission block is determined by a predefined scheme, wherein the scheme is designed in such a manner that one or more bits of the first transmission sub-block and one or more bits of the second transmission sub-block alternately follow one another.

11 Claims, 6 Drawing Sheets

U.S. PATENT DOCUMENTS

| | | | |
|---|---|---|---|
| 5,968,198 A * | 10/1999 | Hassan et al. | 714/752 |
| 6,731,700 B1 * | 5/2004 | Yakhnich et al. | 375/341 |
| 7,200,798 B2 * | 4/2007 | Bickerstaff | 714/794 |
| 7,289,530 B1 * | 10/2007 | Yuan et al. | 370/465 |
| 7,310,768 B2 * | 12/2007 | Eidson et al. | 714/786 |
| 7,499,487 B2 * | 3/2009 | Ginis et al. | 375/222 |
| 7,516,389 B2 * | 4/2009 | Song | 714/755 |
| 7,539,928 B2 * | 5/2009 | Rhee et al. | 714/784 |
| 7,568,147 B2 * | 7/2009 | Eidson et al. | 714/786 |
| 7,657,819 B2 * | 2/2010 | Berkmann et al. | 714/755 |
| 2005/0258985 A1 | 11/2005 | Banister | |
| 2007/0130494 A1 | 6/2007 | Divsalar | |
| 2007/0288833 A1 | 12/2007 | Djurdjevic | |
| 2008/0046799 A1 | 2/2008 | Geller | |

FOREIGN PATENT DOCUMENTS

| | | |
|---|---|---|
| WO | WO/01/06662 | 1/2001 |
| WO | WO/2008/015742 A1 | 7/2008 |

OTHER PUBLICATIONS

Natasa Zivic and Christoph Ruland: "Channel Coding as a Cryptography Enhancer", WSEAS Transactions on Communications, vol. 7, No. 2, Feb. 2008, XP002550613.

Zivic N et al: "Soft Input Decryption", Turbo-Coding-2006 : 4th International Symposium on Turbo Codes & Related Topics; 6th International ITG-Conference on Source and Channel Coding, Vde Verlag, DE, Jan. 1, 2006, pp. 1-4, XP008109458, ISBN: 978-3-8007-2947-0.

Zivic N et al: "Channel coding as a cryptography enhancer", Proceedings of the 11th Conference on 11th WSEAS International Conference on Communications, vol. 11, World Scientific and Engineering Academy and Society, US, vol. 11, Jan. 1, 2007, pp. 273-278, XP008109457, ISSN: 1790-5117.

* cited by examiner

METHOD FOR TRANSMITTING AND RECEIVING A DATA BLOCK AND A CORRESPONDING TRANSMITTER AND RECEIVER

FIELD OF THE DISCLOSED SUBJECT MATTER

The invention relates to a method for transmitting and receiving a data block and to corresponding transmitters and receivers.

BACKGROUND OF THE DISCLOSED SUBJECT MATTER

So-called soft decision and soft-input soft-output (SISO) decoders are known per se from the prior art. Such decoders are known, for example, from WO 2001/006662, U.S. 2007/0130494 A1, U.S. 2005/0258985 A1, U.S. 2007/0288833 A1 and U.S. 2008/0046799 A1.

From the prior art, so-called MAP decoders are also known which also belong to the SISO decoders: Bahl, L., Jelinek, J., Raviv, J., Raviv, F.: Optimal decoding of linear codes for minimizing symbol error rate, IEEE Transactions on Information Theory, IT-20, pp. 284-287, March 1974.

The so-called SOVA decoders also belong to the SISO decoders: Hagenauer, J., Hoher, P.: A Viterbi algorithm with soft-decision outputs and its applications, Proc. IEEE GLOBECOM '89, Dallas, Texas, USA, vol. 3, pp. 1680-1686, November 1989.

Furthermore, soft decision and SISO decoding of Reed Solomon Codes are known from the prior art: 1. Kötter, R., Vardy, A.: Algebraic Soft-Decision Decoding of Reed-Solomon Codes, November 2003 vol. 49, pp. 2809-2825, 2. Kötter, R., Vardy, A.: Soft Decoding of Reed Solomon Codes and Optimal Weight Assignments, 4th International ITG Conference on Source and Channel Coding, pp. 69-74, Berlin, Germany, January 2002. 3. Ponnampalam, V., Grant, A.: An efficient SISO algorithm for Reed-Solomon codes, IEEE Int. Symp. Inform. Theory, Yokohama, Japan, June 29-July 4. 2003, 4. Ponnampalam, V., Vučetić, B.: Soft decision decoding of Reed-Solomon codes, IEEE Trans. Communications, vol. 50, November 2002, pp. 1758-1768, 5. Vardy, A., Be'ery, Y.: Bit-level soft-decision decoding of Reed-Solomon codes, IEEE Trans. Communications., vol. 39, pp. 440-445, March 1991.

From "Feedback in Joint Channel Coding and Cryptography", Christoph Ruland and Nataša Živić 7th International Conference on Source and Channel Coding, Ulm, VDE/ITG 2008, it is known to provide data to be transmitted with a cryptographic check value block by block. Furthermore, a corresponding receiving method is also known from this.

BRIEF SUMMARY OF THE DISCLOSED SUBJECT MATTER

By comparison, the invention is based on the object of creating an improved method for transmitting and receiving a data block and a corresponding transmitter and receiver.

According to embodiments of the invention, a method for transmitting a data block in the form of two or more sub-blocks via a message channel is created according to claim 1. Embodiments of this method are specified in the dependent patent claims.

Embodiments of the invention relate to methods for receiving a data block via a message channel. A transmission sub-block correctly received or corrected by means of an error correction method provides for improved renewed channel decoding of the as yet incorrect transmission sub-blocks, with an increase in the probability that these can be corrected by the channel decoding or a further application of the error correction method.

Embodiments of the invention are particularly advantageous since allocating the bits of the data block to be transmitted to sub-blocks which are in each case provided with check data for error detection and can be separately error-corrected, the successful correction of a sub-block improving the correctabilities of the other sub-block, provides for a reduction in the residual error rate of the receiver at the same signal/noise power ratio.

In this context, the invention is based on the finding that an improved reception can be achieved by the bits to be transmitted being supplied to a channel encoder in a predefined scheme at the transmitter end, the scheme being arranged in such a manner that the bits are taken alternately from the transmission sub-blocks. This can be implemented, e.g. by each bit of the first transmission sub-block which contains a first sub-block and its check data being followed by a bit of the second transmission sub-block which contains a second sub-block and its check data. However, other schemes are also possible: for example, two bits of the first transmission sub-block always follow two bits of the second transmission sub-block or the alternating selection of individual bits or bit groups from the transmission sub-blocks is carried out in accordance with a more complex scheme. It is only essential that the bits to be transmitted alternately belong to the first and to the second transmission sub-block.

Corruptions, especially so-called burst errors, of the signal thus transmitted during its transmission via the message channel statistically frequently relate to bits which originate from different ones of the transmission blocks since, of course, bits from the various transmission blocks follow one another alternately in the signal. At the receiver end, this has the advantage that if one of the transmission blocks is received in an initially uncorrectable manner, the possibility still exists to still reconstruct even this transmission block as will be discussed in detail further below.

According to one embodiment of the invention, the first and second sub-blocks are formed in such a manner that in each case alternately one bit of the data block is allocated to the first sub-block and the subsequent bit is allocated to the second sub-block. For each one of these sub-blocks, redundancy is generated for error detection, i.e. the first and second check data, respectively. The sub-blocks expanded by the information for error detection are called transmission sub-blocks and multiplexed again before they are output to the channel encoder, e.g. bit by bit.

According to a further embodiment of the invention, the order of the bits is initially retained during the division of the data block into the first and second sub-blocks. A deviation of the order of the transmission of the bits from the original order is achieved by the fact that multiplexing of the data transmission sub-blocks, e.g. bit-oriented multiplexing, occurs immediately before the transmission of the bits via the message channel. The result is a transmission block.

According to embodiments of the invention, the check data are cyclic redundancy check (CRC) check data, parity check values, hash values, checksums or the redundancy information of block codes or convolution codes. According to further embodiments of the invention, the check data can be cryptographic check information, so-called cryptographic check values, which are generated particularly with the aid of a symmetric and/or asymmetric pair of keys and/or from the relevant sub-blocks.

In a further aspect, the invention relates to a transmitter for transmitting data blocks via a message channel. The transmitter is constructed in such a manner that it operates in accordance with a method according to the invention.

In a further aspect, the invention relates to a method for receiving a data block via a message channel. Embodiments of this method are specified in the dependent patent claims.

According to embodiments of the invention, a soft-decision line decoder, particularly a demodulator, is used.

According to embodiments of the invention, the soft output of the soft-decision line decoder is input into a SISO channel decoder for channel decoding. The SISO channel decoder can be a MAP decoder, SOVA decoder or another SISO decoder, e.g. for decoding Reed Solomon codes.

The correct reception of the transmission sub-blocks which are recovered by demultiplexing from the transmission block output by the SISO decoder is checked by means of the check data. If both transmission sub-blocks are considered to be received correctly, no further action is necessary.

If, however, the check of the first transmission sub-blocks shows that the first and the second transmission sub-block have not been correctly received initially, the following further steps are carried out:

For each of the first and second transmission sub-blocks, an error correction method is carried out, if necessary. If, however, the check of the first and second transmission sub-blocks shows that only one data transmission sub-block has not been received correctly, the error correction method is only carried out for the incorrect transmission sub-block.

In one embodiment, the error correction method can be carried out in such a manner that one or more bits in the transmission sub-block, to which the lowest reliability values are allocated, are changed. After the change of the bit values, a check is then carried out whether the sub-block thus changed matches the check data allocated to it. If this is the case, this transmission sub-block is considered to have been received correctly. If it is not so, further error correction attempts can be undertaken by changing additional or other bits in the data transmission sub-block, namely, for example, beginning with the bits which have been received least probably correctly. For this purpose, the bits of the data transmission sub-blocks can initially be sorted in accordance with their reliability values.

According to one embodiment of the invention, a transmission sub-block is considered to have been received correctly if the check data, which are generated at the receiver end for the received sub-block of the transmission sub-block, are identical to the received check data of this transmission sub-block.

According to one embodiment of the invention, a transmission sub-block is considered to have been received correctly if the check data, which are generated at the receiver end for the received sub-block of the transmission sub-block, differ from the received check data of this transmission sub-block in no more than a predetermined number of bit positions. The number of different bit positions of the received check data to be compared and of the check data generated at the receiver end are the so-called Hamming distance. Thus, if the Hamming distance between the received check data and the check data generated at the receiver end is not above a predetermined threshold value, the associated sub-block is considered to have been received correctly. If this Hamming distance, in contrast, is above the predetermined threshold value, the sub-block is considered to not have been received correctly.

The error correction method is then preferably carried out in such a manner that one or more bits are changed only in the sub-block of the transmission sub-block to which the lowest reliability values are allocated. In contrast to the embodiment of the error correction method described above, the bit positions of the received check data are thus not taken into consideration but remain unchanged and are also not included in the sorting according to the reliability values.

After the experimental change of one or more of the bit values of the sub-block to be corrected, a check is then made whether the Hamming distance between the received check data and the check data calculated in a verification module via the received and experimentally changed sub-block is not above the predetermined threshold value.

This threshold value is fixed on the basis of the bit error rate after the channel encoding and the characteristics of the encoder. If the Hamming distance is not greater than this threshold value, this sub-block is considered to have been received correctly. If this is not the case, other error correction attempts can be undertaken by changing additional or other bits in the sub-block, for example beginning with the bits which have been received least probably correctly. For this purpose, a sorting of the bits of the sub-blocks in accordance with their reliability values can initially be carried out. If it was possible to correct the received sub-block in this manner, the received check data are corrected by replacing them with the calculated check data. The corrected sub-block with the calculated check data represents the corrected transmission sub-block. This embodiment has the advantage that the error correction attempts are restricted to bit positions in the sub-block.

If an error correction both of the first and of the second transmission sub-block can take place in this manner, no further action is required since a correct reception is then already present. If, in contrast, only one of the first and second transmission sub-blocks has been corrected or received correctly and the correction attempt with the aid of the error correction method has failed for the other ones of the transmission sub-blocks, the following procedure is adopted:

The amounts of the reliability values of the bits of the one of the transmission sub-blocks which could be error-corrected or has been received correctly are increased in order to express in this manner that the bits concerned have been reliably correctly received. For example, the amounts of the reliability values are set to a maximum amount. Furthermore, the reliability values of the bits of the one of the transmission sub-blocks which could not be error-corrected can be reduced in order to express in this manner that probably a number of the relevant bits have reliably not been received correctly. In particular, the reliability values of these bits can be set to zero. As an alternative, the reliability values of these bits can also be left unchanged.

These increased reliability values of the known received bits of the error-corrected or correctly received transmission sub-block and the lowered or identical reliability values of the unknown bits of the uncorrected transmission sub-block are again brought into the same order, according to the structure of the transmission block, as is defined for the transmitted transmission block, and are then again input into the SISO decoder in order to again perform the decoding with the aid of the changed input information.

Since the quality of the input information has been improved due to the positive checking of the check data and possibly the successful error correction, the result of the SISO decoding also of the bits of the other one of the transmission sub-blocks which could initially not be subjected to an error correction, can change.

After this further SISO decoding, the transmission sub-blocks of the data block are again checked with regard to their correct reception, wherein the checking can be optionally restricted to the transmission sub-block which could previously not be corrected, using the assistance of the check data allocated to this transmission sub-block. The repeated checking of the one of the transmission sub-blocks which could already be error-corrected before the repeated SISO decoding can be optionally omitted since, of course, this transmission sub-block is already considered to have been received correctly.

If after the second SISO decoding, the other one of the transmission sub-blocks is now also correct, no further action is necessary. If, in contrast, this transmission sub-block is still not correct, the error correction method is carried out again for this transmission sub-block. In this context, it is possible to proceed in the same manner as during the first performance of the error correction method before the repeated SISO decoding, i.e. the reliability values for the error correction method are used, for example by sorting the bits in the transmission sub-block or sub-block in the order of the amounts of the reliability values in order to change the bits with low reliability amount values in one or more iterations. It is only when this further error correction attempt, too, fails with regard to the other one of the sub-blocks that the error-free reception of the relevant data block has finally failed.

Embodiments of the method according to the invention for receiving a data block are particularly advantageous since a lower error rate of the transmission can be achieved with a code rate which is reduced only slightly or not reduced.

According to embodiments of the invention, the code rate can be increased by so-called puncturing. The puncturing can be carried out, for example, with a rate so that the reduction of the code rate caused by adding the check data to the sub-blocks is compensated for.

According to embodiments of the invention, a data block to be transmitted can also be divided into more than two sub-blocks which are in each case provided with check data. The possibilities are then correspondingly increased that, beginning with the successful correction of one of the transmission sub-blocks, the other transmission sub-blocks, which could not be recognized as being correct in the preceding pass can then be corrected by an iterative application of the error correction method and of the SISO decoding. Thus if a first quantity of transmission sub-blocks, after an initially incorrect reception, could be error-corrected with the aid of the error correction method and a second quantity of transmission sub-blocks, after an initially incorrect reception could not be error-corrected with the aid of the error correction method, the reliability values of the transmission sub-blocks of the first quantity are increased since, of course, reliability with regard to the correct reception exists in this regard and the SISO channel decoding is carried out on the basis of the changed reliability values for the transmission block.

This also correspondingly applies if a third quantity of transmission sub-blocks is received equally correctly without requiring an error correction. The reliability values of the bits of the transmission sub-blocks of the third quantity can also be increased in order to repeat the SISO channel decoding.

BRIEF DESCRIPTION OF THE FIGURES

In the further text, embodiments of the invention are explained in greater detail with reference to the drawings, in which.

DETAILED DESCRIPTION OF THE DISCLOSED SUBJECT MATTER

Elements of the subsequent embodiments which correspond to one another are in each case identified with the same reference symbols.

Figure 1:
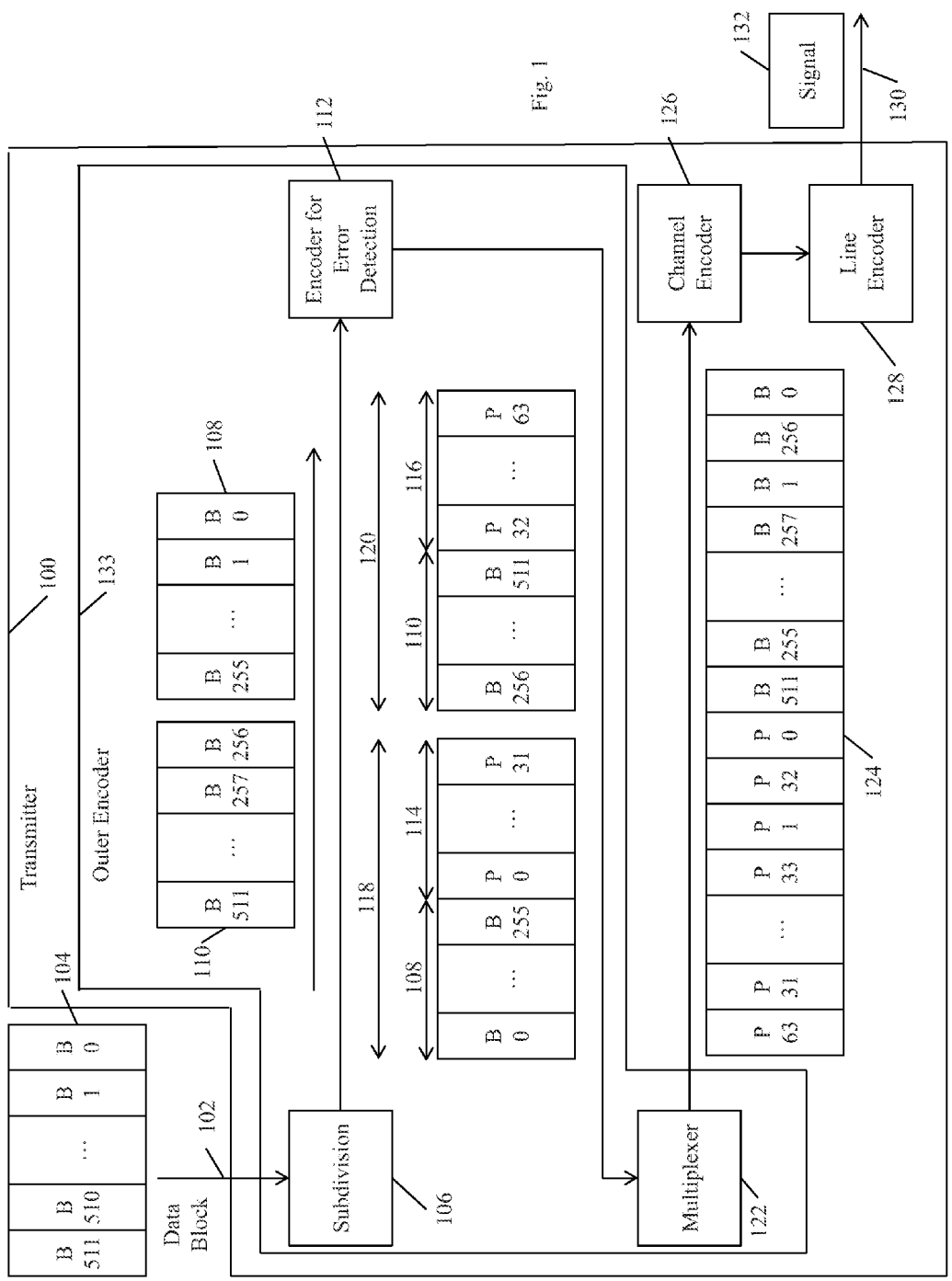
FIG. 1 shows a block diagram of one embodiment of a transmitter according to the invention.

FIG. 1 shows one embodiment of a transmitter 100 according to the invention. The transmitter 100 has an input 102 for inputting data blocks to be transmitted. FIG. 1 shows illustratively a data block 104 to be transmitted. The data block 104 has, for example, a length of 512 bits with bit positions B0, B1, B2, . . . , B511. The data block can be a part of a data stream, i.e. many data blocks follow one another.

The transmitter 100 has a dividing module 106 for dividing a data block to be transmitted such as, for example, the data block 104, into at least one first sub-block 108 and one second sub-block 110. Depending on the embodiment, the sub-blocks into which each of the data blocks is divided can be of equal length of or different length. In the embodiment considered here, they are divided into two equally long sub-blocks 108 and 110. The original order of the bits in the data block 104 is retained in the embodiment considered here, i.e. bits B0 to B255 form sub-block 108 in this order and the subsequent bits B256 to B511 form the second sub-block 110. However, the data blocks can also be divided into more than two sub-blocks. The several sub-blocks can again be of equal or different length, the manner of dividing being predefined.

The transmitter 100 also has an encoder 112. The encoder is used for coding the sub-block with an error-detecting code separately for each of the sub-blocks. The encoder preferably deals with a block code. The check data are, for example, a CRC, parity bits, a checksum, a one-way hash function value, redundancy values of a systematic block code or of an unsystematic code or the like.

The encoder 112 can also be constructed for generating cryptographic check data such as, for example, for generating a digital signature of a message authentication code (MAC) or of a hashed message authentication code (H-MAC). Digital signatures can be generated by the encoder 112, for example, according to ISO 9796-2, ISO 14888 or ISO 15946-4. MACs can be generated according to ISO/IEC 9797-1, DES, 3-DES or AES [ISO/IEC 18033-3]. H-MACs can be generated according to ISO/IEC 9797-2 by the encoder for error detection 112.

In the exemplary case considered here, the encoder 112 thus generates first check data 114 for the first sub-block 108 and second check data 116 for the second sub-block 110. In the diagrammatical exemplary case considered here, the check data 114 contain the bit positions P0, P1, . . . , P31 and the check data 116 contain bit positions P32, . . . , P63. If several sub-blocks are generated by the dividing module 106, such check data are generated by the encoder 112 for each of the sub-blocks.

For example, the sub-blocks are extended by their respective check data, i.e. sub-block 108 with check data 114 and sub-block 110 with check data 116 as shown in FIG. 1 in order to generate in this manner corresponding transmission sub-blocks, i.e. in this case the transmission sub-block 118 and the transmission sub-block 120, respectively. For each sub-block, one transmission sub-block is thus generated which contains the relevant sub-block and its check data.

Without restriction to the general applicability, a systematic block code is used in the subsequent exemplary embodiments, in which the redundancy, i.e. the check information is appended to the data bits as check data. However, it is also possible to use a code which allocates to the input symbols code symbols which contain the redundancy in a non-systematic manner.

The encoder 112 for error detection at the receiver end can implement a so-called cryptographic check function such as, for example, for generating a digital signature MAC or H-MAC. For example, the check data 114 are the digital signature of sub-block 108 which is generated with a secret key which is stored, for example, in the encoder 112. It can be a similar case with the check data 116 which can represent the digital signature of sub-block 110.

The transmitter 100 also has a multiplexer 122. The multiplexer 122 is used for multiplexing the bits, present for transmission, of the transmission sub-blocks 118 and 120 so that the order of the bits of the transmission block 124 produced deviates from the original order of the bits in data block 104. The multiplexing is carried out in accordance with a predefined scheme. For example, the multiplexer has a separate input for each one of the transmission sub-blocks.

In the embodiment considered here, the scheme is defined in such a manner that bit-by-bit multiplexing occurs, i.e. firstly, the first bit position B0 of transmission block 118 is transmitted, after that the first bit position B256 of transmission block 120, then the second bit position B1 of the transmission sub-block 118, then the second bit position B257 of transmission sub-block 120, etc. The transmission block 124 output by the multiplexer, which contains the transmission sub-blocks 118 and 120, is then subjected to a channel coding by a channel encoder 126. The channel coding provides for at least one error detection, preferably an error correction.

Finally, the channel-coded transmission block 124 is prepared for the immediate transmission via a message channel 130 with the aid of a so-called line encoder 128. The line encoder 128 can be, for example, a modulator. The line encoder 128 outputs the line-encoded signal 132 which is then transmitted via the message channel 130. The message channel 130 can be formed as a so-called "base band" or a "broadband" channel.

The channel encoder 126 can implement, for example, a so-called convolutional coding scheme or turbo code scheme.

The transmitter 100 can thus implement here a concatenated coding. The outer code, generated by the so-called outer encoder 133 of the concatenated code is here formed by the dividing module 106 which carries out the dividing into two or more sub-blocks, the encoder 112 for the sub-blocks and the multiplexer, i.e. the transmission block 124 presents the results of the outer encoder 133 in the exemplary case considered here. The inner coding, in contrast, is carried out by the channel encoder 126, for example with the aid of a convolutional code or turbo code. Preferably, a code which is particularly suitable for SISO decoding is selected for the channel encoder 126.

The embodiment of FIG. 1 is particularly advantageous since during the dividing of the data block 102 by the dividing module 106, the original order of the bits is initially retained. This dispenses with a temporary storage of the bits at the input end.

Figure 2:
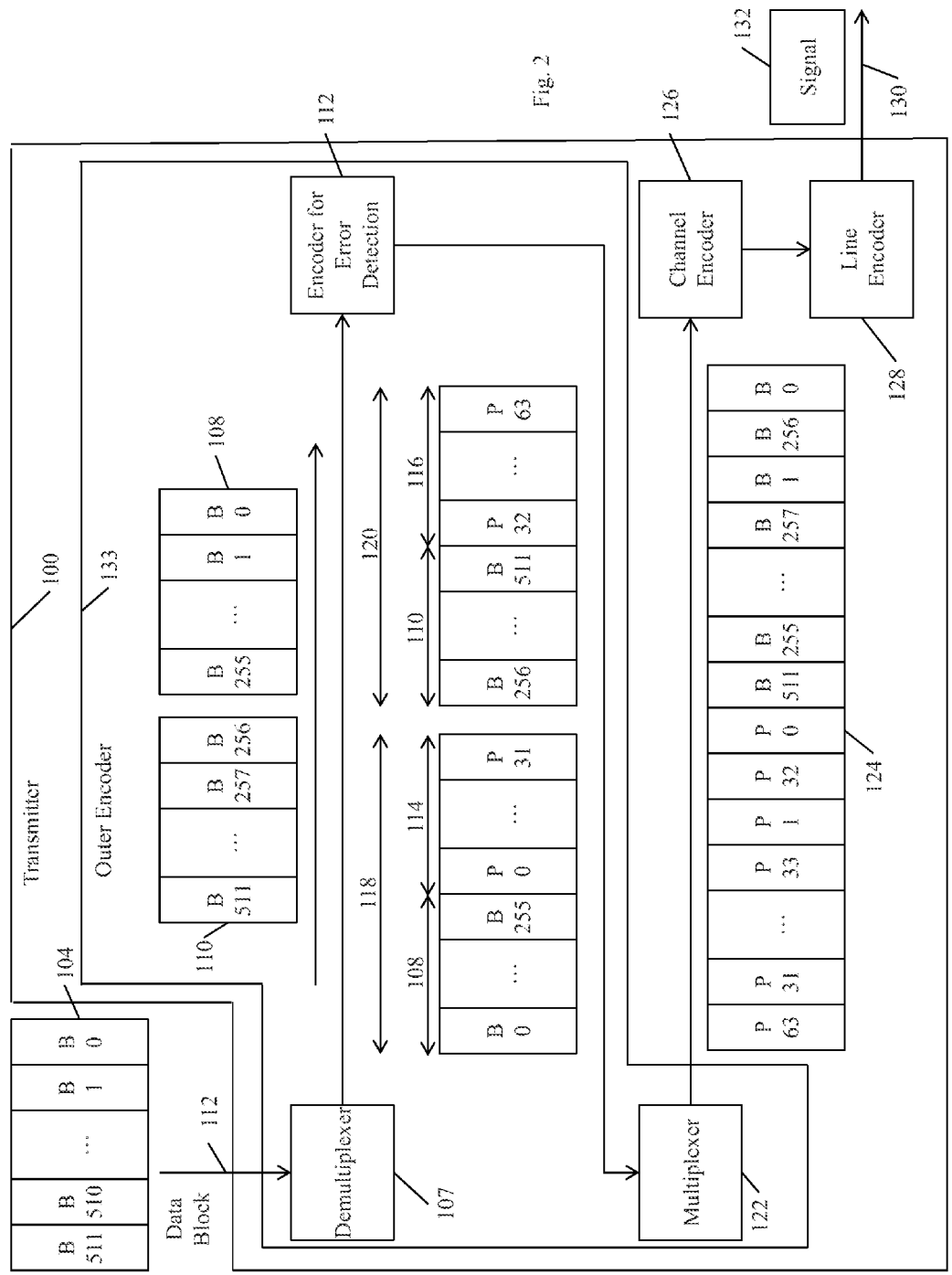
FIG. 2 shows a block diagram of a further embodiment of a transmitter according to the invention.

FIG. 2 represents an embodiment of the invention which differs from FIG. 1 in that the sub-blocks 108 and 110 are formed from the data block 104 in a different manner. Instead of dividing successive bits into sub-blocks, the bits of data block 104 are here separated into the sub-blocks by the demultiplexer 107, e.g. bit by bit: the first bit B0 is allocated to the first sub-block 108, the second bit B1 is allocated to the second sub-block 110, the third bit B2 is again allocated to the first sub-block 108 etc.

All other components are identical with the transmitter 100 shown in FIG. 1.

The embodiment of the transmitter 100 according to FIG. 2 has the advantage that the delay at the transmitter end, caused by the outer encoder 133, is less than in the embodiment according to FIG. 1 since the order of bits of data block 104 corresponds to the order of bits in transmission block 124.

Figure 3:
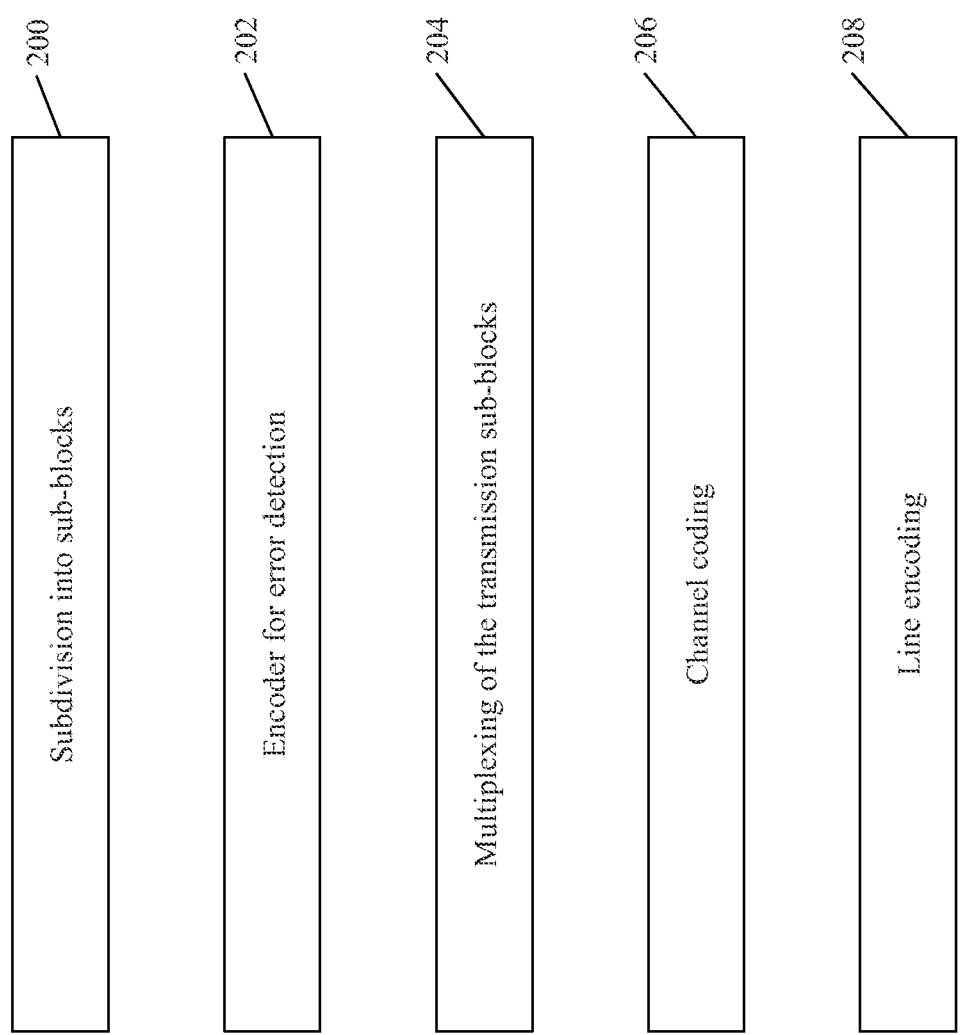
FIG. 3 shows a flowchart of an embodiment of a method according to the invention for transmitting a data block.

FIG. 3 shows a corresponding flowchart. In step 200, the data block is input into the transmitter by a data source. The data block is then divided into at least two sub-blocks which can have identical or different lengths. In one embodiment, the dividing can be carried out by demultiplexing.

The sub-blocks are subsequently subjected to a coding for error detection in step 202. This can be done with the aid of a systematic or non-systematic code, of a block code or convolutional code or a so-called cryptographic check function. In step 204, the order of the bit positions to be transmitted is then changed. This can be done by bit-by-bit multiplexing of the transmission sub-blocks with the respective appended check data. A different predefined scheme for changing the order can also be applied.

In the subsequent step 206, the bit sequence resulting from step 204, i.e. the transmission block, is subjected to a channel coding, the channel coding being preferably carried out in a code which is provided for a SISO decoding at the receiver end. The channel-coded bit sequence is then subjected to a line coding in step 208, i.e., for example, the bit sequence is transmitted with the aid of a modulation method.

Figure 4:
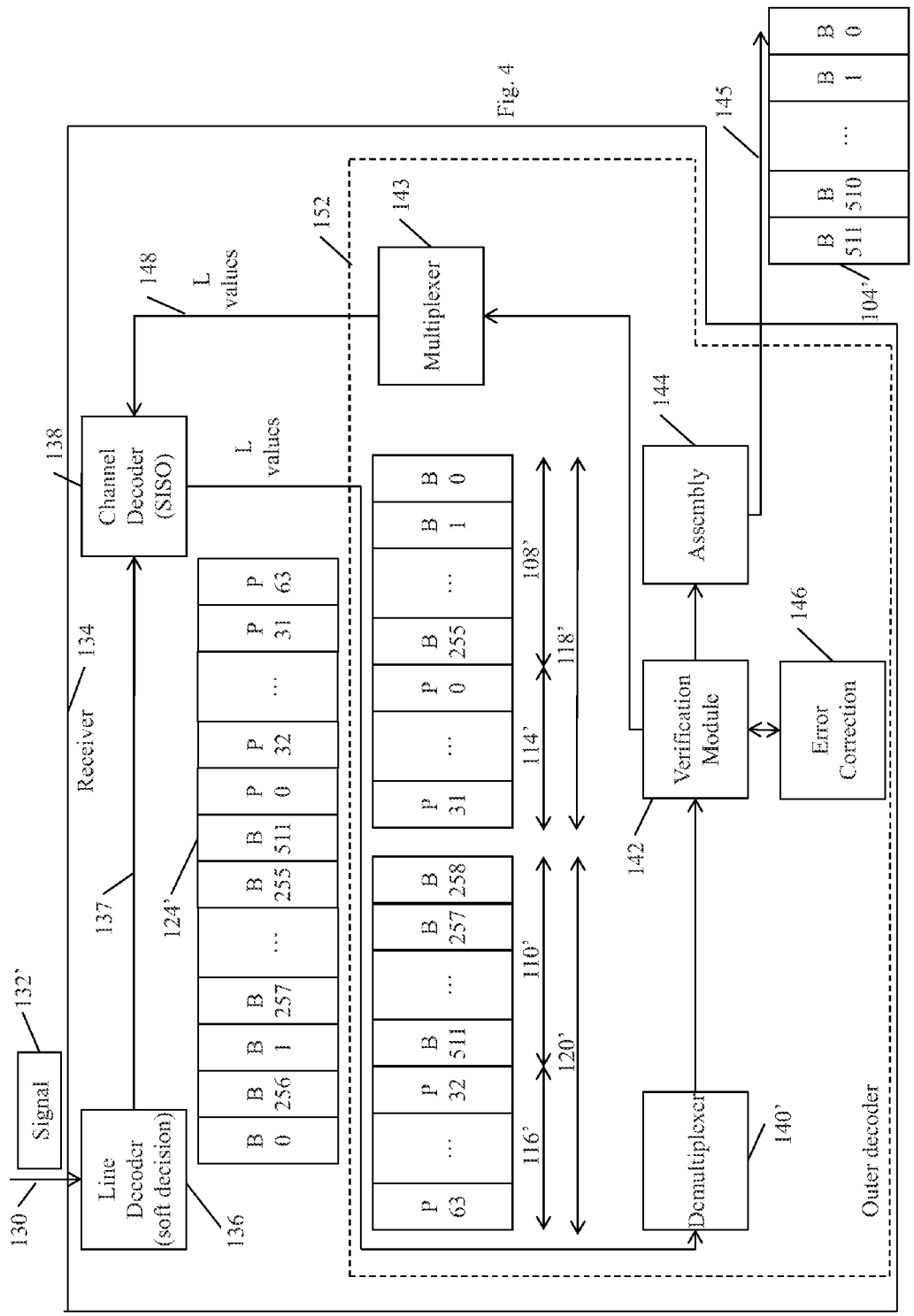
FIG. 4 shows a block diagram of an embodiment of a receiver according to the invention matching the transmitter according to FIG. 1.

FIG. 4 shows one embodiment of a receiver 134 according to the invention, which is used for receiving the signals 132 output by the transmitter 100 (compare FIG. 1), which are received as signals 132'. It is assumed that signals 132 and 132' differ due to disturbances during the transmission via channel 130. The receiver 134 has a line decoder 136 for decoding the coding carried out by the line encoder 128 of the transmitter 100. The line decoder 136 can be, for example, a demodulator.

The line decoder 136 performs soft decision and delivers corresponding output values to the SISO channel decoder 138. The SISO channel decoder 138 decodes the coding carried out by the channel encoder 126 of the transmitter 100. The channel decoder 138 is thus the inner decoder.

The channel decoder 138 operates in accordance with the SISO principle, i.e. it processes the soft output generated by the line decoder 136 as a soft input and itself delivers a soft output, preferably in the form of so-called L values.

The sign of an L value output by the channel decoder 138 specifies the value of the bit received. For example, a negative sign of the L value stands for a bit value of a logical 0 and a positive sign of the L value stands for a bit value of a logical 1. On the other hand, the amount of the L value specifies the reliability with which the decision has been made whether the relevant bit is a 0 or a 1. The lowest possible amount of the L value is in this case 0. An L value of 0 means that the probability of the correctness of the decision for the relevant bit is 0.5. If, on the other hand, the amount of the L value has a predetermined maximum value, this means that the correctness of the relevant bit value can be considered to be reliable.

The channel decoder 138 outputs as soft output the potentially still disturbed transmission block 124'. Transmission block 124' can be present in such a form that each of the bit positions is represented by an L value or that each of the bits is additionally provided with an L value.

The receiver 134 also has a demultiplexer 140 in order to recover the potentially disturbed transmission sub-blocks 118' and 120' from the transmission block 124'. For this purpose, the demultiplexer 140 cancels the multiplexing performed by the multiplexer 122.

The receiver 134 also has a verification module 142 which is used for checking the correct reception of the transmission sub-blocks 118' and 120', respectively.

This checking is done by means of the check data 114' and 116', respectively, which have been generated at the transmitter end by the encoder 112 (compare FIGS. 1 and 2).

The verification module 142 checks for transmission sub-block 118' whether the redundancy to sub-block 108', which is contained in bits P0 to P31 of the check data 114', is valid or not. Similarly, the verification module 142 checks the validity of the check data 116' for sub-block 110' of the transmission block 124'.

If the check data, for example are digital signatures of the sub-blocks which have been generated by encoder 112, these signatures are checked by the verification module 142 with the aid of the public key allocated to the secret key by means of which the signatures have been generated.

If one of the signatures has been recognized as valid, the corresponding transmission block is considered to have been received correctly. If the signature of one of the transmission sub-blocks is recognized as invalid, this transmission sub-block is considered to have been received as incorrect.

If it is found during the checking of the check data 114' and 116' by the verification module 142 that both transmission sub-blocks 118' and 120' have been received correctly, the assembly module 144 of the receiver 134 reassembles the two sub-blocks 108' and 110' by concatenating the sub-blocks in accordance with the dividing module 106 of transmitter 100 and outputs at its output 145 the received data block 104' recognized as correct.

In the case where one of the transmission sub-blocks 118' and 120' has not been received as correctly recognized, the receiver 134 has an error correction module 146. The error correction module 146 is constructed in such a manner that it implements an error correction method for error correction of in each case one of the transmission sub-blocks. In the error correction method, the reliability values of the individual bit positions are preferably taken into consideration.

In one embodiment, this can occur in such a manner that initially the bit position or the bit positions having the lowest absolute reliability values in the transmission sub-block to be corrected, such as, for example, transmission sub-block 118', are identified. The bit value at the bit position having the lowest absolute reliability value is then experimentally changed. Transmission block 118' having the bit value thus changed is then again subjected to a check for validity with the aid of the check data 114' by the verification module 142. If this new check shows that the check data 114' are valid, a successful error correction of the transmission sub-block 118' is assumed so that the latter is considered to be identical with the original transmission block 118.

If, in contrast, the new check also shows that the check data 114' are not valid even after changing the bit value with the lowest absolute reliability value, the error correction attempt has failed. Following this, one or more further error correction attempts can be carried out.

In a second error correction attempt, for example, the bit value having the second lowest absolute reliability value, then an error correction attempt with the changed bits having the lowest absolute reliability value and the second-lowest absolute reliability value can be performed. Once the bit values at the relevant bit positions have been changed, the transmission sub-block thus modified is in each case again subjected to a check in the verification module 142. This process can be repeated until either an error correction attempt is successful or an abort condition is reached. This abort condition can be, for example, an admissible maximum number Nmax≦0 of error correction attempts.

The error correction taking into consideration the L values can also take place as known per se from Chase, D.: A Class of Algorithms for Decoding Block Codes with Channel Measurement Information, IEEE Trans. Inform. Theory, IT-18, pp. 170-182, January 1972.

For example, the L values of the bits of transmission block 118', after sorting the size of their amounts, are present in the following order:

L(B3)=+0.5
L(B2)=−10
L(B255)=+15
L(B1)=+20
L(P1)=+32
L(B0)=+50
L(P2)=−56
L(P63)=−60
L(P0)=−100

Let it be assumed that bits B2, B3 of sub-block 110 and bit P1 of sub-block 116' have been actually decoded wrongly by the inner decoder, i.e. channel decoder 138.

In this case, the error correction method of error correction module 146 is started: initially, the bit position having the lowest reliability value in transmission sub-block 118' is identified. This is bit position B3 here. Since the L value of bit position B3 is 0.5, bit position B3 initially has a bit value of a logical 1. Due to the lowest reliability value at bit position B3, the bit value of the latter is experimentally changed from 1 to 0. The resultant changed transmission sub-block 118' is then again subjected to a check by using the check data 114'.

If this shows that the transmission sub-block could not be corrected, a further attempt can be undertaken: for example, the bit value at the bit positions having the second-lowest reliability amount is now changed, the bit value of bit position B2 in the exemplary case considered here. If the transmission sub-block could not be corrected again, the bit values of the bit positions having the lowest and the second-lowest reliability amounts are changed, i.e. the bit value of bit position B2 is here changed from a logical 0 to a logical 1 and the bit value at bit position B3 is changed from a logical 1 to a logical 0. Using the transmission sub-block 118' thus changed again, another check is performed in the verification module 140 by means of check data 114'. If the bit values of the bit positions up to the fifth-lowest reliability amounts are modified, the transmission sub-block can be corrected in the exemplary case given because the fifth-lowest L value represents bit P1 which has been wrongly decoded.

There are also other strategies for error correction which, for example, take into consideration the error characteristics of channel 130.

A further embodiment of the invention is based on the finding that transmission disturbances of sub-blocks 108 and 110, respectively, lead to a significant number of different bits between check data 114 and 114' and 116 and 116', respectively. The Hamming distance H of the check data which have been received and of the check data which are calculated by the verification module via the sub-block received is therefore taken as a criterion whether a sub-block is correct. If H does not exceed a particular threshold value, the sub-block is present correctly, and some bits of the check data have been disturbed during the transmission. In this case, the received check data 114' and 116', respectively are replaced by the calculated check data. It is thus assumed that the transmission sub-blocks 118' and 120' are present in the correct manner. If H is above the specified threshold value, it is assumed that the sub-block which has been received is not correct. This is because, particularly when cryptographic methods are applied for generating the check data, already a single faulty bit in a sub-block can lead to entirely different check data generated at the receiver end for this faulty sub-block so that thus a single faulty bit in the sub-block already leads to a large Hamming distance between the received check data of this sub-block and the check data generated at the receiver end. In a reverse conclusion, the correct reception of the sub-block can be assumed from a small Hamming distance between the received check data of this sub-block and the check data generated at the receiver end.

The threshold value for H depends on the encoder 112 and the bit error rate after the channel decoder 138.

Corresponding to this fact, there is an embodiment of the error correction module in which the error correction method described is only applied to the bit positions of sub-block 108' and 110', respectively. Instead of checking whether sub-block and check data are identical, it is checked whether the Hamming distance of check data 114' and 116', respectively, and of the check data calculated in the verification module via the received sub-block 108' and 110', respectively, is not above the specified threshold value. If this is the case, the corrected sub-block and the calculated check data form the corrected transmission sub-block 118' and 120', respectively.

For example, the following procedure is adopted in this embodiment: the verification module 142 generates for the received sub-blocks 108' and 110' their check data 114" and 116", respectively, the same method being used for generating these check data as is used at the transmitter end by encoder 112 (compare FIGS. 1 and 2).

If the Hamming distance H between the check data 114" generated at the receiver end and the received check data 114' is not above the predetermined threshold value, sub-block 108' is considered to have been received correctly. In the opposite case, sub-block 108' is considered to have been received as incorrect. A corresponding procedure is adopted for sub-block 110' and its check data 116" and 116', respectively.

In the further text, it is assumed, without restriction of general applicability, that the Hamming distance H between the check data 116" and 116' of sub-block 110' is above the predetermined threshold value so that sub-block 110' is considered to have been received incorrectly.

For the error correction, the error correction method disclosed above is then performed only for the bit positions of sub-block 110', the bit positions of the check data 116' remaining unconsidered for carrying out the error correction method. For example, the bit positions of sub-block 110' are initially sorted in accordance with their reliability values and the bit values of such bit positions are then experimentally changed beginning with the bit positions of low reliability values.

A sub-block 110' thus experimentally changed is then returned by the error correction module 146 to the verification module 142 where the sub-block 110' is checked for correctness by means of the received check data 116'.

For this purpose, check data 116" are again generated by the verification module 142 for the sub-block 110' now experimentally changed. The verification module decides by means of the Hamming distance H between these check data 116" and the received check data 116' whether the correction attempt of sub-block 110' was successful, by comparing the Hamming distance with the predetermined threshold value as stated above.

If the check data 116" and 116' now have a Hamming distance which is not above the threshold value, the experimentally changed sub-block 110' is considered to be correct. In the opposite case, the verification module 142 can initiate a further error correction attempt of the error correction module 146 for sub-block 110' until a successful error correction occurs or an abort condition is reached.

In the case where one or both of the transmission sub-blocks 118' or 120' has initially been received incorrectly, but this could be rectified by carrying out the error correction method by the error correction module 146, the data block 104' recognized as correct will also be output in this case.

The data block 104' recognized as correct does not necessarily have to be error-free and identical to the data block 104 of transmitter 100 since it may occur that the verification module recognizes that the check information for the sub-block is accepted as valid although this is not the original sub-block. This can be the case if the changes on the disturbed channel and/or in conjunction with the changes during the error correction lead to a transmission sub-block 118' and/or 120' which is recognized as being correct. However, such a situation is improbable up to virtually impossible depending on the selected coding method for the outer encoder 133.

Thus, the components consisting of demultiplexer 140, verification module 142 with the error correction module 146, multiplexer 143 and assembly module 144 which reassembles the data bits of sub-blocks 108' and 110' to form one data block 104', form the so-called outer decoder 152.

Embodiments of the present invention are then particularly advantageous in the following situation: initially, both transmission sub-blocks 118' and 120' were not received correctly which resulted in a first check by the verification module 142. An error correction was then attempted for both transmission sub-blocks 118' and 120' with the aid of the error correction module 146. If such an error correction attempt is successful with regard to one of the transmission sub-blocks but is unsuccessful for the other transmission sub-block, the following procedure is adopted:

In the further text, it is assumed, without restricting general applicability, that an error correction of transmission sub-block 118' with the aid of the error correction module 146 was successful, but was unsuccessful for transmission sub-block 120'. In this case, the verification module 142 sets the amounts of the L values of transmission sub-block 118' to a maximum reliability value since, of course, there is now reliability with regard to the correct bit values of the transmission sub-block 118'. The L values of transmission sub-block 120' can be reduced since, as is known, they are at least partially incorrect; for example, the L values can be set to zero, but they can also remain unchanged depending on implementation.

These changed L values of transmission sub-blocks 118' and 120' are transferred by the verification module to a multiplexer 143 which remultiplexes the bits of transmission sub-blocks 118' and 120' in accordance with the operating mode of the multiplexer 122 at the transmitter end so that the order of L values is identical with the order of the bits of transmission block 124'. These multiplexed L values are input into the channel decoder 138. As an alternative, it is also possible to proceed in such a manner that the soft output 137 of the line decoder 136 is temporarily stored. The L values in the temporarily stored soft output 137 are then changed and the soft output 137 thus changed is again input into the channel decoder 138.

With the aid of these changed L values 148 of transmission block 124', the output 137 of the line decoder 136 is thus again supplied to the channel decoder 138, either from the multiplexer 143 or from the buffer store (not shown in the figure), depending on implementation.

The channel decoder 138 thereupon outputs the resultant transmission block 124' with the associated reliability values for each bit which is again divided by the demultiplexer into transmission sub-blocks 118' and 120' which are in each case supplied to the verification module 142. If the check by the verification module 142 shows that the transmission sub-block 120' has now been received correctly, the data block 104' recognized as being correct is output after the assembly module 144 has reconcatenated the data bits of sub-blocks 108' and 110'.

If, on the other hand, the check of the transmission sub-block 120' in the verification module 142 shows that it is still not correct, another error correction can be attempted with the aid of the error correction module 146.

According to a further embodiment, data block 104 is divided at the transmitter end into at least one further third sub-block (not shown in the figure). From this, a third transmission sub-block is generated which, apart from the third sub-block, also contains its third check data, analogously to the generation of the first 118 and second transmission sub-blocks 120. The first, second and third transmission sub-blocks are combined to form a resultant transmission block, using a scheme which allows bits of the first, second and third transmission sub-blocks to follow one another alternately in the resultant transmission block. For example, a bit of the second transmission sub-block always follows a bit of the first transmission sub-block and a bit of the third transmission sub-block follows a bit of the second transmission sub-block.

It shall be assumed without restricting general applicability that the third transmission sub-block has been received correctly without error correction, and that an error correction of the transmission sub-block 118' with the aid of the error correction module 146 was successful, but failed for the transmission sub-block 120'.

In this case, the verification module 142 sets not only the amounts of the L values of transmission sub-block 118' to a maximum reliability value (compare the above-mentioned example for two transmission sub-blocks), but also the L values for the bit positions of the third transmission sub-block since, of course, there is reliability with regard to the correct bit values also of the third transmission sub-block. The L values of transmission sub-block 120' can be reduced since, of course, they are at least partially not correct as is known; for example, the L values can be set to zero, but they can also remain unchanged depending on implementation.

These changed L values of the transmission sub-blocks are then used for again performing the SISO channel decoding. The further sequence of the method is analogous to the above-mentioned embodiment with two transmission sub-blocks.

Figure 5:
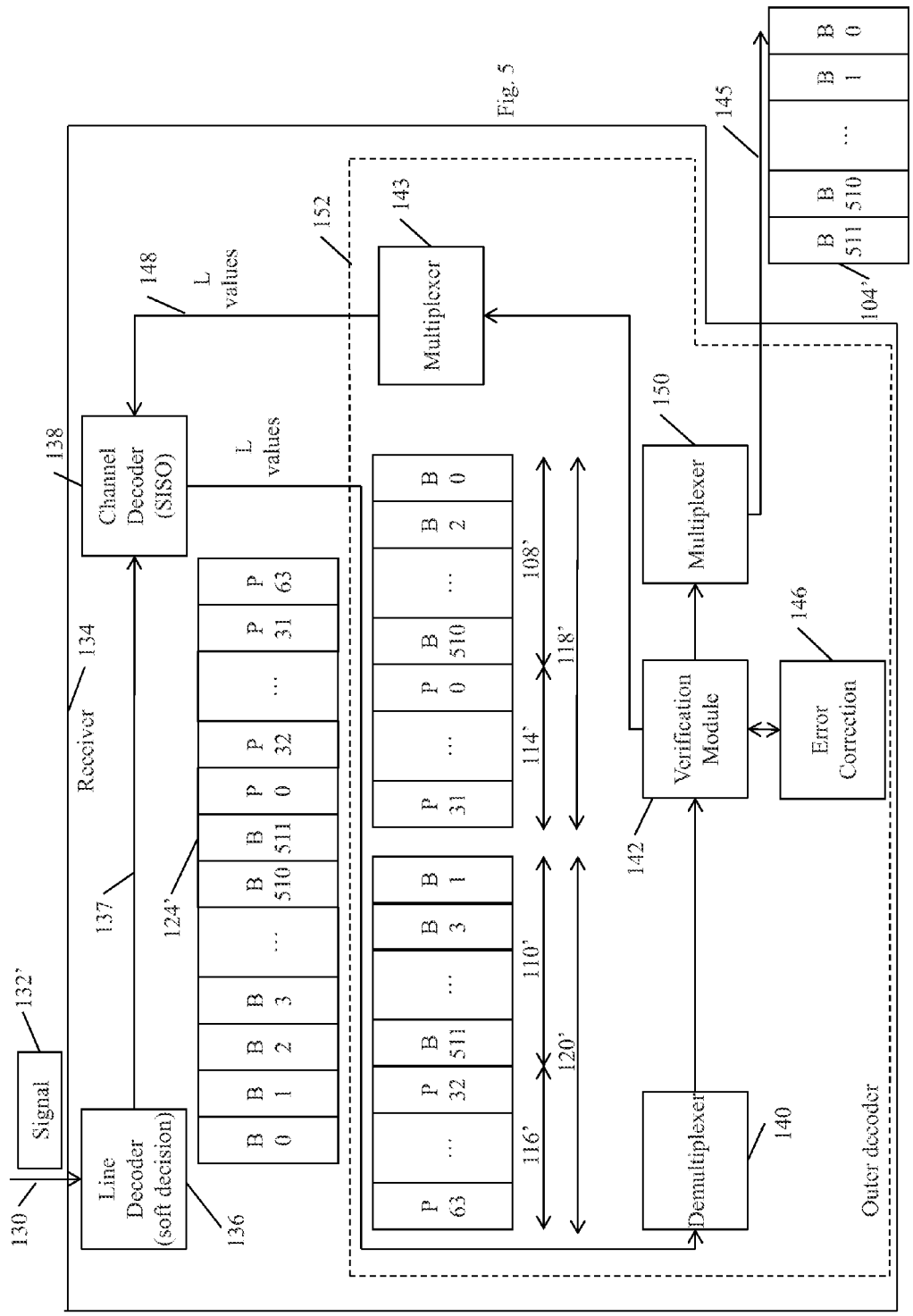
FIG. 5 shows a block diagram of a further embodiment of a receiver according to the invention, matching the transmitter according to FIG. 2.

FIG. 5 shows a further embodiment of a receiver according to the invention which corresponds to the embodiment of the transmitter of FIG. 2. In distinction from the embodiment according to FIG. 4, the assembly of the two sub-blocks 108' and 110' to form the data block 104' in the output 145 is done by multiplexing (alternatively 1 bit of sub-block 108', one bit of sub-block 110', in the case of a transmitter according to FIG. 2) in the embodiment of FIG. 5, for which purpose a multiplexer 150 is provided instead of the assembly module 144.

Figure 6:
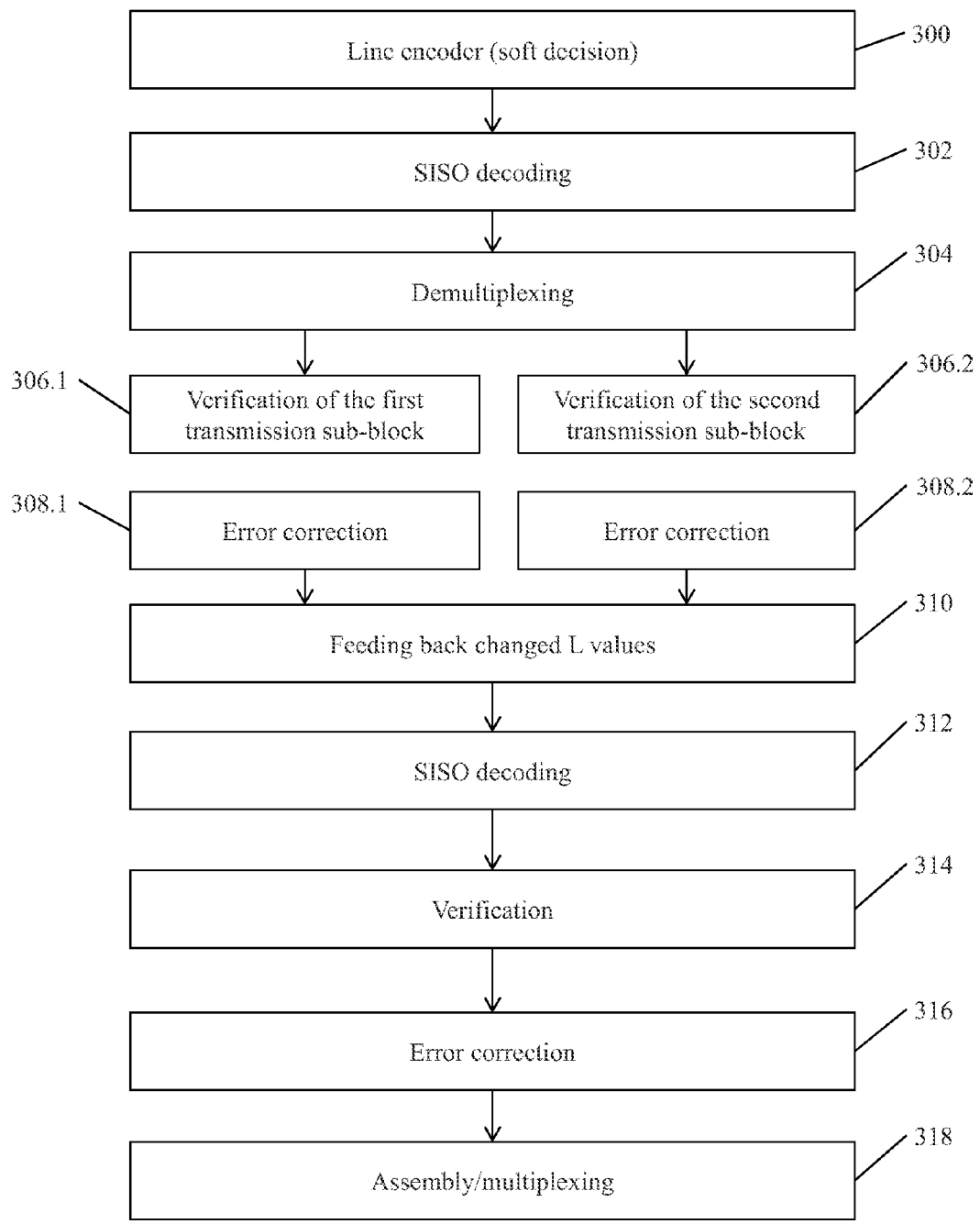
FIG. 6 shows a flowchart of an embodiment of a method according to the invention for receiving a data block.

FIG. 6 shows a corresponding flowchart. In step 300, the receiver receives a signal via a disturbed channel.

The signal is decoded by a soft decision line decoder. In the subsequent step 302, a SISO channel decoding occurs. Following this, the transmission sub-blocks are demultiplexed in step 304.

In step 306.1, the first transmission sub-block is then verified, compare transmission sub-block 118' of FIGS. 4 and 5. If the verification shows that the first transmission sub-block has not been received correctly, the attempt of an error correction takes place in step 308.1 with the aid of the error correction method described above. A corresponding procedure is adopted in steps 306.2 and 308.2 with respect to the second transmission sub-block.

In the text which follows, it is again assumed without restricting general applicability that initially both transmission sub-blocks have not been received correctly so that steps 308.1 and 308.2 have been carried out for the respective error correction. In this context, only one error correction of the first transmission sub-block has been possible in step 308.1; performance of the error correction method in step 308.2 for the second transmission sub-block has failed, in contrast.

In this case, the amounts of the L values of the first transmission sub-block are set to a maximum amount in step 310 since, of course, there is now reliability with regard to their correct reception. In contrast, the amounts of the L values of the bit positions of the second transmission block are reduced, for example set to zero. As an alternative, the L values of the second transmission block can also remain unchanged or have other values.

Subsequently, a SISO decoding which, in principle, runs identically to the SISO decoding in step 302, is again performed in step 312, however on the basis of the L values changed in step 310. From the resultant data transmission block 124' of the SISO decoding of step 312, the second transmission sub-block 120' is extracted, e.g. by the demultiplexer 140 (compare FIG. 5), and again subjected to a verification in 314.

It may be necessary that the error correction method is again performed in step 316 for correcting the second transmission sub-block output in step 312. If the error correction method is now successful, the bits of the two sub-blocks 108' and 110' are concatenated, e.g. by the assembly module 144 in the embodiment of FIG. 4 or by the multiplexer 150 in the embodiment of FIG. 5, in order to return the bits into the original order of data block 104.

If the method finally cannot successfully correct the transmission sub-blocks, the behavior is dependent on implementation, e.g. the data bits of the two sub-blocks can be brought into the correct order and output by the assembly module 144 or the multiplexer 150 as in the successful case, a notification being provided that the bits of the sub-block which could not be recognized as being correct are possibly not correct.

According to embodiments of the invention, puncturing occurs at the transmitter end in order to increase the code rate. For example, bit positions are deleted in equidistant intervals from the data signal 124 (compare FIGS. 1 and 2) by the puncturing. In this case, the puncturing is cancelled by the receiver 134 in that the bit positions deleted at the transmitter end are filled up again before the SISO channel decoder 138 of the receiver 134.

LIST OF REFERENCE DESIGNATIONS

100 Transmitter
102 Input 104,104' Data block before transmission, after reception
106 Dividing module
107 Demultiplexer
108,108' Sub-block before transmission, after reception
110, 110' Sub-block before transmission, after reception
112 Encoder for generating an error-detecting code
114,114' Check data before transmission, after reception
116,116' Check data before transmission, after reception
118,118' Transmission sub-block before transmission, after reception
120,120' Transmission sub-block before transmission, after reception
122 Multiplexer
124,124' Transmission block before transmission, after reception with L values
126 Channel encoder
128 Line encoder
130 Message channel
132 Signal
133 Outer encoder
134 Receiver
136 Line decoder
137 Output of the soft decision line decoder
138 SISO channel decoder
140 Demultiplexer
142 Verification module
143 Multiplexer
144 Assembly module
146 Error correction module
145 Output
148 L values
150 Multiplexer
152 Outer decoder

The invention claimed is:

1. A method for receiving a data block, the method comprising the following steps:
performing line decoding of a signal carrying a transmission block, wherein the transmission block has a first transmission sub-block consisting of a sub-block of the data block and first check data and a second transmission sub-block consisting of a second sub-block of the data block and second check data,
outputting results of the line decoding after a soft decision for each received bit of the transmission block,
performing soft-input soft-output channel decoding of the transmission block, wherein an output reliability value which specifies the reliability value of the decision of the channel decoder for the correctness of the relevant bit is output as the result of the decoding for each received bit,
verifying a correct reception of the first and second sub-blocks based on the first and of the second check data, respectively,
if necessary, performing error correction with respect to the first and/or second transmission sub-blocks,
if the performance of error correction was required for both the first and the second of the transmission sub-blocks and the performance of the error correction for one of the first and second transmission sub-blocks is successful and fails for another one of the first and second transmission sub-blocks, increasing the output reliability values which are allocated to the bits of the one of the transmission sub-blocks and repeated performance of the channel decoding, wherein the increased output reliability values allocated to the bits of the one of the transmission sub-blocks are used as input reliability values for the repeated performance of the channel decoding,
checking the correct reception of the other one of the transmission blocks after performance of the repeated channel decoding and, if necessary, repeating the performance of the error correction with respect to the other one of the data transmission blocks.

2. The method as claimed in claim 1, wherein the first and second check data are cryptographic check data.

3. The method as claimed in claim 1, wherein the output reliability values allocated to the bits of the first and/or the second transmission sub-block to be corrected are used for performing the error correction.

4. The method as claimed in claim 3, wherein the bits of the transmission sub-block to be corrected are sorted in accordance with the output reliability values and wherein the values of one or more bits are experimentally changed, beginning with the lowest reliability, to obtain a transmission sub-block recognized as correct after one or more experimental changes.

5. The method as claimed in claim 1, wherein only the output reliability values allocated to the bits of the first and/or second sub-block to be corrected are used for performing the error correction.

6. The method as claimed in claim 5, wherein the bits of the sub-block to be corrected are sorted in accordance with the output reliability values and wherein the values of one or more bits are experimentally changed, beginning with the lowest reliability, to obtain a sub-block recognized as being correct after one or more experimental changes.

7. The method as claimed in claim 1, comprising the following further step:
reducing the output reliability values which are allocated to the bits of the other one of the transmission blocks, for the repeated performance of the decoding.

8. The method as claimed in claim 1, wherein the transmission block contains a third transmission sub-block, wherein the third transmission sub-block consists of a third sub-block of the data block and third check data, wherein the third transmission sub-block is received correctly without error correction and wherein the output reliability values allocated to the third transmission sub-block are increased, wherein additionally to the increased output reliability values allocated to the bits of the one of the transmission sub-blocks, the increased output reliability values of the bits of the third transmission block are also used as input reliability values for the repeated performance of the channel decoding.

9. The method as claimed in claim 1, wherein the verification of the correct reception of one of the transmission sub-blocks includes the following steps:
generating third check data for the received sub-block of the one of the transmission sub-blocks at the receiver end,
calculating the Hamming distance between the third check data and the received second check data,
if the Hamming distance is less than a predetermined threshold value: the received sub-block is considered to have been received correctly,
if the Hamming distance is greater than a predetermined threshold value: the received sub-block is considered to have been received incorrectly and the method for error correction is carried out for correcting the sub-block.

10. A receiver for receiving a data block comprising:
means for line decoding of a signal carrying a transmission block, wherein the transmission block has a first transmission sub-block with a first sub-block of a data block and first check data and a second transmission sub-block with a second sub-block of the data block and second check data, wherein the means for line decoding are designed in such a manner that the output of the results of the line decoding occurs in the form of a soft decision for each received bit of the transmission block, means for soft-input soft-output channel decoding of the transmission block, wherein an output reliability value which specifies the reliability value of the correct reception of the relevant bit is output as the result of the decoding for each received bit, means for checking the correct reception of the first and second sub-blocks based on the first or of the second check data, respectively, means for performing error correction with respect to the first and/or second transmission sub-blocks, means for repeating the decoding if the performance of the error correction is required for both the first and the second one of the transmission sub-blocks and the performance of the error correction is successful for one of the first and second transmission sub-blocks and fails for another one of the first and second transmission sub-blocks, wherein the output reliability values allocated to the bits of the one of the transmission sub-blocks are increased, wherein in the case of the repeated performance of the decoding, the increased output reliability values allocated to the one of the transmission sub-blocks are used as input reliability values for the repeated performance of the decoding.

11. The receiver as claimed in claim 10, wherein the means for checking the correct reception are designed for generating third check data for a received sub-block, wherein the received sub-block is considered to have been received correctly if the Hamming distance between the third check data and the second check data is less than a predetermined threshold value.

* * * * *